United States Patent
Hagleitner et al.

(10) Patent No.: US 9,640,627 B2
(45) Date of Patent: May 2, 2017

(54) SCHOTTKY CONTACT

(75) Inventors: Helmut Hagleitner, Zebulon, NC (US); Saptharishi Sriram, Cary, NC (US)

(73) Assignee: Cree, Inc., Durham, NC (US)

( * ) Notice: Subject to any disclaimer, the term of this patent is extended or adjusted under 35 U.S.C. 154(b) by 708 days.

(21) Appl. No.: 13/414,286

(22) Filed: Mar. 7, 2012

(65) Prior Publication Data

US 2013/0234278 A1    Sep. 12, 2013

(51) Int. Cl.

| | |
|---|---|
| H01L 21/28 | (2006.01) |
| H01L 29/47 | (2006.01) |
| H01L 21/285 | (2006.01) |
| H01L 29/872 | (2006.01) |
| H01L 29/778 | (2006.01) |
| H01L 29/20 | (2006.01) |
| H01L 29/40 | (2006.01) |
| H01L 29/45 | (2006.01) |

(52) U.S. Cl.
CPC ...... *H01L 29/475* (2013.01); *H01L 21/28581* (2013.01); *H01L 29/7786* (2013.01); *H01L 29/872* (2013.01); *H01L 29/2003* (2013.01); *H01L 29/402* (2013.01); *H01L 29/452* (2013.01)

(58) Field of Classification Search
USPC ............... 257/20, 24, 27, 192, 194–195, 257/E29.241–E29.253
See application file for complete search history.

(56) References Cited

U.S. PATENT DOCUMENTS

| | | | |
|---|---|---|---|
| 5,459,087 A | 10/1995 | Mochizuki | |
| 5,631,479 A | 5/1997 | Shiga | |
| 8,035,130 B2 * | 10/2011 | Nanjo et al. | 257/194 |
| 2005/0151255 A1 * | 7/2005 | Ando et al. | 257/750 |
| 2006/0157735 A1 | 7/2006 | Kanamura et al. | |

(Continued)

FOREIGN PATENT DOCUMENTS

| | | |
|---|---|---|
| JP | 61290775 | 12/1986 |
| JP | 2008117874 A | 5/2008 |
| JP | 2011238805 A | 11/2011 |

OTHER PUBLICATIONS

Hashizume, Tamotsu et al., "Surface Control Process of AlGaN for Suppression of Gate Leakage Currents in AlGaN/GaN Heterostructure Field Effect Transistors", Japanese Journal of Applied Physics, 2006, pp. L111-L113, vol. 45, No. 4.

(Continued)

*Primary Examiner* — Ali Naraghi
(74) *Attorney, Agent, or Firm* — Myers Bigle, P.A.

(57) ABSTRACT

The present disclosure relates to a Schottky contact for a semiconductor device. The semiconductor device has a body formed from one or more epitaxial layers, which reside over a substrate. The Schottky contact may include a Schottky layer, a first diffusion barrier layer, and a third layer. The Schottky layer is formed of a first metal and is provided over at least a portion of a first surface of the body. The first diffusion barrier layer is formed of a silicide of the first metal and is provided over the Schottky layer. The third layer is formed of a second metal and is provided over the first diffusion barrier layer. In one embodiment, the first metal is nickel, and as such, the silicide is nickel silicide. Various other layers may be provided between or above the Schottky layer, the first diffusion barrier layer, and the third layer.

15 Claims, 7 Drawing Sheets

(56) References Cited

U.S. PATENT DOCUMENTS

| | | | |
|---|---|---|---|
| 2007/0158683 | A1 | 7/2007 | Sheppard et al. |
| 2008/0290371 | A1 | 11/2008 | Sheppard et al. |
| 2009/0057718 | A1 | 3/2009 | Suvorov et al. |
| 2009/0078966 | A1 | 3/2009 | Asai et al. |
| 2010/0038680 | A1* | 2/2010 | Nakayama et al. .......... 257/190 |
| 2011/0057232 | A1 | 3/2011 | Sheppard et al. |
| 2011/0101377 | A1 | 5/2011 | Suvorov et al. |
| 2011/0156051 | A1 | 6/2011 | Green et al. |
| 2013/0082307 | A1 | 4/2013 | Okamoto et al. |

OTHER PUBLICATIONS

Liu, Q.Z. et al., "Ni and Ni Silicide Schottky Contacts on n—GaN", Journal of Applied Physics, Jul. 15, 1998, pp. 881-886, vol. 84, No. 2.

International Search Report for PCT/US2013/026342, mailed Jun. 12, 2013, 12 pages.

Restriction Requirement for U.S. Appl. No. 13/668,540, mailed Oct. 11, 2013, 5 pages.

Non-Final Office Action for U.S. Appl. No. 13/668,540, mailed Nov. 26, 2013, 5 pages.

Chen, C.P. et al., "Enhancement of Schottky Barrier Height to n-GaAs Using NiAl, NiAl/Al/Ni, and Ni/Al/Ni Layer Structures," Journal of Vacuum Science and Technology, vol. 12, No. 4, Pt. II, Jul. 1, 1994, pp. 1915-1919.

Readinger, E.D. et al., "Thermal Stability of Metallizations on GaN/AlxGa1_xN/GaN Heterostructures," Semiconductor Science and Tecnology, vol. 20, No. 5, May 2005, pp. 389-397.

Venugopalan, H.S. et al., "Approaches to Designing Thermally Stable Schottky Contacts to n-GaN," Semiconductor Science Technology, vol. 14, No. 9, Sep. 1, 1999, pp. 757-761.

Invitation to Pay Additional Fees for PCT/US2013/067206, mailed Dec. 12, 2013, 8 pages.

International Preliminary Report on Patentability for PCT/US2013/026342, mailed Sep. 18, 2014, 8 pages.

International Search Report and Written Opinion for PCT/US2013/067206, mailed Mar. 7, 2014, 17 pages.

Non-Final Office Action for U.S. Appl. No. 13/668,540, mailed Feb. 23, 2015, 5 pages.

Non-final Office Action for U.S. Appl. No. 13/668,540, mailed Jun. 26, 2014, 7 pages.

Notice of Allowance for U.S. Appl. No. 13/668,540, mailed Oct. 17, 2014, 7 pages.

Final Office Action for U.S. Appl. No. 13/668,540, mailed Mar. 7, 2014, 6 pages.

Advisory Action for U.S. Appl. No. 13/668,540, mailed May 16, 2014, 2 pages.

Venugopalan, H.S. et al., "Interfacial reactions between nickel thin films and GaN," Journal of Applied Physics, vol. 82, No. 2, Feb. 7, 1997, 5 pages.

Written Opinion for PCT/US2013/067206 mailed Nov. 25, 2014, 12 pages.

International Preliminary Report on Patentability for PCT/US2013/067206, mailed Jan. 21, 2015, 7 pages.

\* cited by examiner

SCHOTTKY CONTACT

FIELD OF THE DISCLOSURE

The present disclosure relates to contacts for semiconductor devices, and in particular to Schottky contacts.

BACKGROUND

Semiconductor devices, such as high electron mobility transistors (HEMTs), Schottky diodes, metal semiconductor field effect transistors (MESFETS) and the like employ a Schottky contact. Schottky contacts are generally metal contacts that are formed on a semiconductor material to create a metal-semiconductor junction that tends to provide a rectifying effect due to an inherent potential barrier that is formed at the metal-semiconductor junction.

A Schottky contact may be created by forming one or more layers on the surface of a semiconductor body where the Schottky contact is desired. For example, a Schottky gate contact for a HEMT maybe formed on the semiconductor body and between corresponding source and drain contacts. If the semiconductor material on which the HEMT's Schottky gate contact is formed includes aluminum gallium nitride (AlGaN), two common metals that are often used in a Schottky gate contact for a HEMT are nickel (Ni) and gold (Au). A Ni layer may be formed over the semiconductor body, and an Au layer may be formed over the Ni layer. Notably, other layers may be provided between the Ni and Au layers.

The Ni layer is formed over the AlGaN to form the lower Schottky layer of the Schottky gate contact. Ni is often used with AlGaN due to the relatively high barrier height provided between these two materials. The upper Au layer is formed at or near the top of the Schottky gate contact to form a contact layer. Use of Au for the contact layer helps to minimize resistance associated with the Schottky gate contact.

Unfortunately, when Ni and Au are used in the different layers of a Schottky gate contact, the Ni in the Schottky layer tends to diffuse into the Au of the contact layer, and the Au of the contact layer tends to diffuse into the Ni of the Schottky layer at elevated fabrication and operational temperatures. As such, the Ni and Au in the Schottky gate contact mix with each other. These issues are not limited to Ni and Au. For example, Aluminum (Al) is often used as an alternative to Au for the contact layer, and Al readily mixes with Ni.

When the various metals in the Schottky gate contact mix with one another, the performance of the Schottky gate contact, and thus the HEMT as a whole, is often significantly degraded. For example, the leakage currents of the Schottky gate contact may significantly increase to unacceptable levels. Similar issues arise in other devices, such as Schottky diodes and MESFETs, which employ Schottky contacts, and in devices that are fabricated using other material systems.

Accordingly, there is a need for an improved Schottky contact that substantially prevents, or at least significantly reduces, the extent to which metals from the different layers mix with one another during fabrication and operation.

SUMMARY

The present disclosure relates to a Schottky contact for a semiconductor device. The semiconductor device has a body formed from one or more epitaxial layers, which reside over a substrate. The Schottky contact may include a Schottky layer, a first diffusion barrier layer, and a third layer. The Schottky layer is formed of a first metal and is provided over at least a portion of a first surface of the body. The first diffusion barrier layer is formed of a silicide of the first metal and is provided over the Schottky layer. The third layer is formed of a second metal and is provided over the first diffusion barrier layer. In one embodiment, the first metal is nickel, and as such, the silicide is nickel silicide. Various other layers may be provided between or above the Schottky layer, the first diffusion barrier layer, and the third layer.

One technique for fabricating the Schottky contact involves initially forming the Schottky contact to have a Schottky layer precursor formed of a first metal and a first diffusion barrier layer precursor formed of silicon. The Schottky layer is formed over a portion of the first surface, and the first diffusion barrier layer precursor is formed over the Schottky layer precursor. An annealing process is employed to form the first diffusion barrier layer from the first diffusion barrier layer precursor. The annealing process involves heating the Schottky contact such that the silicon of the first diffusion barrier layer precursor and the first metal of the Schottky layer react with one another, wherein the silicon of the first precursor layer is substantially, if not completely, consumed. The remaining portion of the Schottky layer precursor forms the Schottky layer. In one embodiment, the first diffusion barrier layer precursor is completely consumed during the annealing process.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
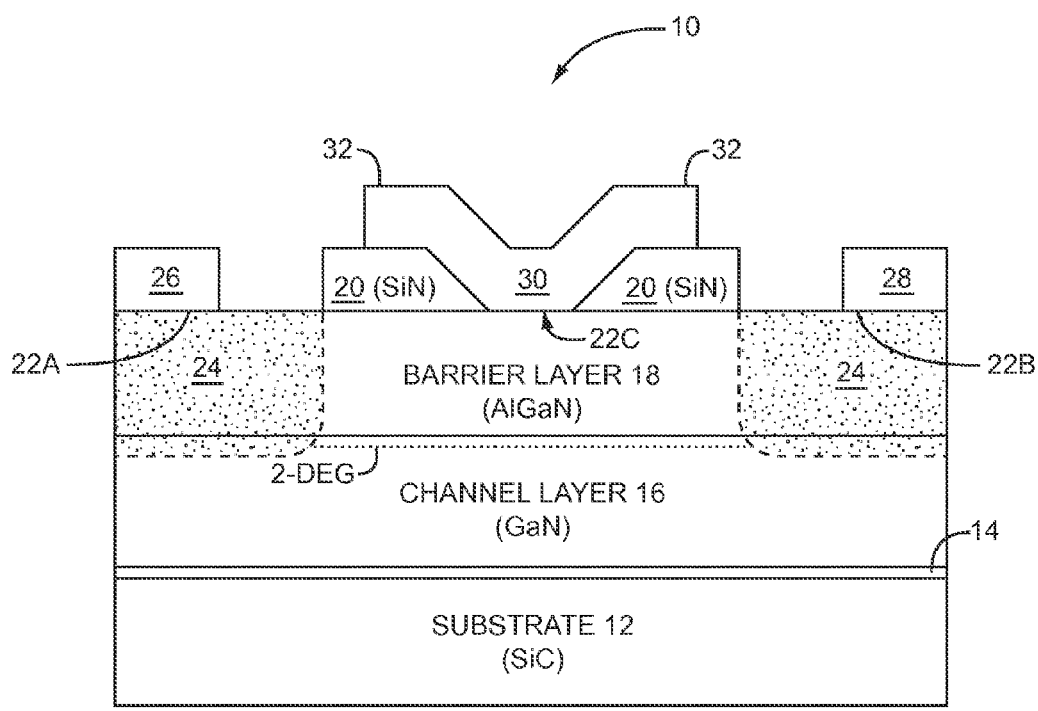
FIG. 1 illustrates a high electron mobility transistor (HEMT) with a Schottky gate contact according to one embodiment of the disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The present disclosure relates to a Schottky contact for a semiconductor device. The semiconductor device has a body formed from one or more epitaxial layers, which reside over a substrate. The Schottky contact may include a Schottky layer, a first diffusion barrier layer, and a third layer. The Schottky layer is formed of a first metal and is provided over at least a portion of a first surface of the body. The first diffusion barrier layer is formed of a silicide of the first metal and is provided over the Schottky layer. The third layer is formed of a second metal and is provided over the first diffusion barrier layer. In one embodiment, the first metal is nickel, and as such, the silicide is nickel silicide. Various layer other layers may be provided between or above the Schottky layer, the first diffusion barrier layer, and the third layer.

One technique for fabricating the Schottky contact involves initially forming the Schottky contact to have a Schottky layer precursor formed of a first metal and a first diffusion barrier layer precursor formed of silicon. The Schottky layer is formed over a portion of the first surface, and the first diffusion barrier layer precursor is formed over the Schottky layer precursor. An annealing process is employed to form the first diffusion barrier layer from the first diffusion barrier layer precursor. The annealing process involves heating the Schottky contact such that the silicon of the first diffusion barrier layer precursor and the first metal of the Schottky layer react with one another, wherein the silicon of the first diffusion barrier layer precursor layer is substantially, if not completely, consumed. The remaining portion of the Schottky layer precursor forms the Schottky layer. In one embodiment, the first diffusion barrier layer precursor is completely consumed during the annealing process.

Prior to delving into the details of the Schottky contact of the present disclosure and an exemplary technique for fabricating the same, an overview of an exemplary high electron mobility transistor (HEMT) 10 on which the Schottky contact may be employed is provided in association with FIG. 1. In the illustrated example, the HEMT described is a Gallium Nitride (GaN) based device that is formed on substrate 12 formed of Silicon Carbide (SiC). Those skilled in the art will recognize the applicability to the concepts of the present disclosure for various devices, including Schottky diodes, metal semiconductor field effect devices (MESFETs), and the like, using various material systems.

In the illustrated example, the substrate 12 is a semi-insulating substrate formed of a 4H polytype of SiC. Optional SiC polytypes include 3C, 6H, and 15R polytypes. The term "semi-insulating" is used in a relative rather than absolute sense. Alternative materials for the substrate 12 may include sapphire, aluminum nitride (AlN), aluminum gallium nitride (AlGaN), gallium nitride (GaN), silicon (Si), gallium arsenide (GaAs), zinc oxide (ZnO), and indium phosphide (InP). The substrate 12 is generally between 300 micrometers and 500 micrometers☐ thick.

A nucleation layer 14 may be formed over the substrate 12 to provide an appropriate crystal structure transition between the SiC of the substrate 12 and the various epitaxial layers that are to be formed over the substrate 12. The nucleation layer 14 may be a single layer or a series of layers. The nucleation layer 14 is generally between 300 micrometers and 500 micrometers thick.

A channel layer 16 is formed over the nucleation layer 14 with one or more epitaxial layers. For this example, the channel layer 16 is a Group III-nitride, such as GaN or $Al_XGa_{1-X}N$, where $0 \leq X < 1$. In other embodiments, the channel layer 16 may be indium gallium nitride (InGaN), aluminum indium gallium nitride (AlInGaN) or the like. The channel layer 16 may be undoped, or at least unintentionally doped, and may be grown to a thickness of greater than about 20 Angstroms. In certain embodiments, the channel layer 16 may employ a multilayer structure, such as a superlattice or alternating layers of different Group III-nitrides, such as GaN, AlGaN or the like.

A barrier layer 18 is formed on the channel layer 16. The barrier layer 18 may have a bandgap that is greater than the bandgap of the underlying channel layer 16. Further, the barrier layer 18 may have a smaller electron affinity than the channel layer 16. In this illustrated embodiment, the barrier layer 18 is AlGaN; however, the barrier layer 18 may include AlGaN, AlInGaN, AlN or various combinations of these layers.

The barrier layer 18 is generally between 20 Angstroms and 400 Angstroms thick; however, the barrier layer 18 should not be so thick as to cause cracking or substantial defect formation therein. The barrier layer 18 may be either undoped, or at least unintentionally doped, or doped with an n-type dopant to a concentration less than about $1 \times 10^{19}$ $cm^{-3}$.

As shown in FIG. 1, a dielectric layer 20 is formed on the barrier layer 18 and is etched using known etching techniques to the shape shown. The dielectric layer 20 may include silicon nitride (SiN), silicon dioxide ($SiO_2$), aluminum silicon nitride (AlSiN), silicon oxynitride (SiON), or the like. It will be understood that the terms "SixNy," "SiN," and "silicon nitride" are used herein interchangeably to refer to both stoichiometric and non-stoichiometric silicon nitride.

Other materials may also be used for the dielectric layer 20. For example, the dielectric layer 20 could also include magnesium oxide, scandium oxide, aluminum oxide and/or aluminum oxynitride. Furthermore, the dielectric layer 20 may be a single layer or may include multiple layers of uniform or nonuniform composition. The material of the dielectric layer 20 should be capable of withstanding relatively high temperatures, and should allow at least a portion to be removed without significantly damaging the underlying barrier layer 18.

In general, the dielectric layer 20 may provide a relatively high breakdown field strength and a relatively low interface trap density at the interface with an underlying Group III-nitride layer such as the barrier layer 18. The dielectric layer 20 may have a high etch selectivity with respect to the material of the barrier layer 18, and may not be reactive to the material of the barrier layer 18. Moreover, the dielectric layer 20 may have a relatively low level of impurities therein. For example, the dielectric layer 20 may have a relatively low level of hydrogen and other impurities, including oxygen, carbon, fluorine and chlorine. The dielectric layer 20 is generally between 800 Angstroms and 2000 Angstroms thick.

As illustrated, the dielectric layer 20 is etched to expose surface portions 22A, 22B, and 22C of the barrier layer 18. The area beneath the surface portion 22A corresponds to the drain region, and the area beneath the surface portion 22B corresponds to the source region. The areas beneath the surface portions 22A and 22B, which correspond to the drain and source regions, are subjected to a "shallow implant" to form respective shallow implant regions 24, which are shown with hashing. The shallow implant regions 24 extend through barrier layer 18 and at least partially into the channel layer 16. As such, the ions for the doping material come to rest in both the barrier layer 18 and at least the upper portion of the channel layer 16 beneath the surface portions 22A and 22B.

As used herein, the term "shallow implant" means that the implants are made directly into the barrier layer with no substantive capping or protection layer over the surface portions 22A, 22B of the barrier layer 18 during implantation. The implanted ions of the doping material may be implanted such that the peak of the implant profile is located just below the interface between the channel layer 16 and the barrier layer 18 where a two-dimensional electron gas (2-DEG) plane is formed during operation and in which electron conductivity is modulated. While the doping concentrations may vary based on desired performance parameters, first exemplary doping conditions may provide implant regions 24 with a peak doping concentration of $1\times10^{18}$ cm-3 or greater and a straggle of 50 nm or less. For example, in some embodiments, the dose and energy of the implants may be selected to provide a peak doping concentration of about $5\times10^{19}$ cm-3 and a straggle of about 30 nm. In order to form n-type implant regions 24 in a nitride based barrier layer 18, the implanted ions may include silicon ions, sulfur ions, oxygen ions, or a combination thereof.

On the surface portion 22A, a drain contact 26 is formed. The drain contact 26 is an ohmic contact that cooperates with the implant region 24 residing beneath the surface portion 22A to provide a low resistance connection to the drain region of the HEMT 10. Similarly, on the surface portion 22B, a source contact 28 is formed. The source contact 28 is an ohmic contact that cooperates with the implant region 24 residing beneath the surface portion 22B to provide a low resistance connection to the source region of the HEMT 10. The source and drain regions connect with the opposite sides of the 2-DEG plane, which is just below the junction of the channel layer 16 and barrier layer 18. Exemplary configurations for the drain contact 26 and the source contact 28 are provided further below.

As noted above, the dielectric layer 20 is also etched to expose the surface portion 22C of the barrier layer 18. The surface portion 22C resides between the surface portions 22A and 22B and corresponds to a gate region of the HEMT 10. A Schottky gate contact 30 is formed with one or more metallic layers over the surface portion 22C of the barrier layer 18. As illustrated, a portion of the Schottky gate contact 30 may be formed directly on the barrier layer 18, which itself may be formed from multiple epitaxial layers. Typically, an opening is etched through the dielectric layer 20 to expose the surface portion 22C. As illustrated, the Schottky gate contact 30 may have a portion that resides within the opening in contact with the surface portion 22C as well as portions that reside along the sidewalls of the opening and on an upper surface of the dielectric layer 20 on either side of the opening. The portions of the Schottky gate contact 30 that reside on the upper surface of the dielectric layer 20 on either side of the opening form field plates 32. The field plates 32 reduce the negative impact of nearby electromagnetic fields on the gate of the HEMT 10.

Figure 2:
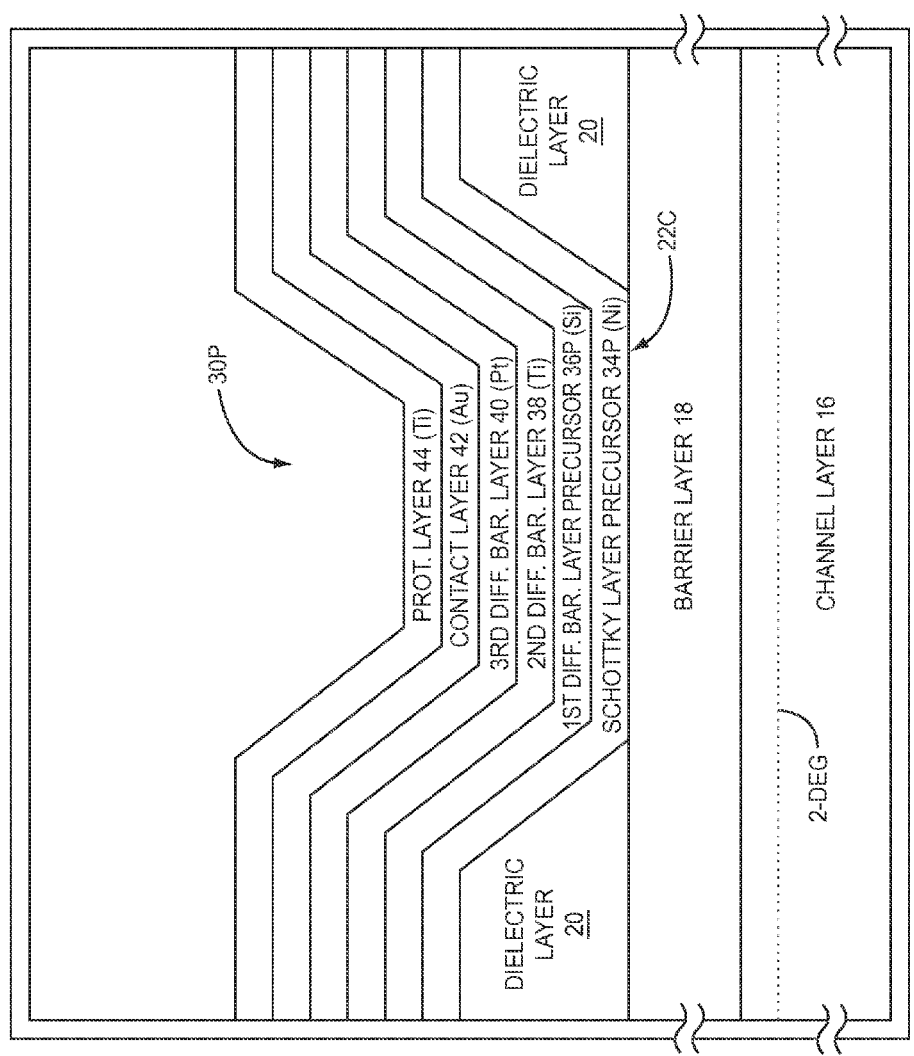
FIG. 2 illustrates a Schottky gate contact precursor according to one embodiment of the disclosure.
Figure 3:
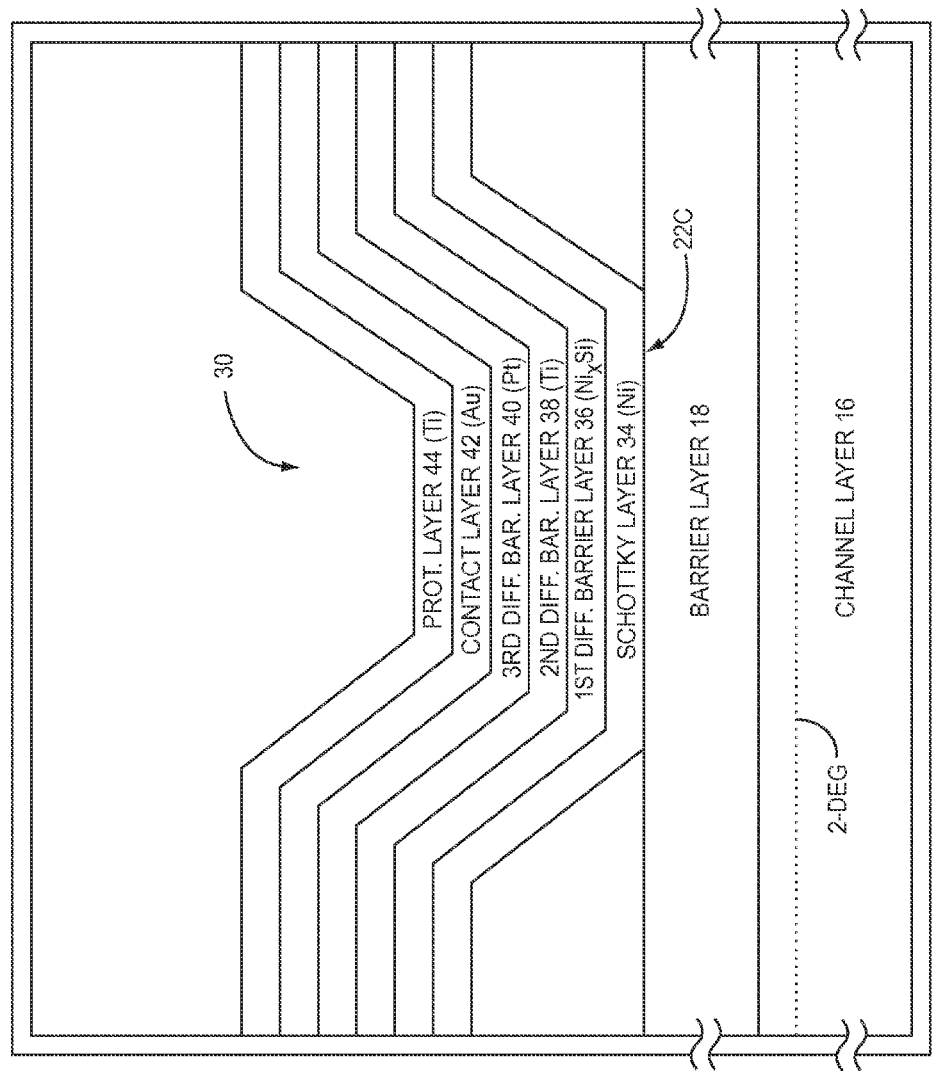
FIG. 3 illustrates a Schottky gate contact after the Schottky gate contact precursor is subjected to thermal annealing according to one embodiment of the disclosure.

With reference to FIGS. 2 and 3, an exemplary process for forming the Schottky gate contact 30 is described. FIG. 2 illustrates the structure of a Schottky gate contact precursor 30P, which is annealed as described below to form the actual structure of the Schottky gate contact 30, which is illustrated in FIG. 3. The particular process for forming and the actual structures of the illustrated Schottky gate contact precursor 30P and Schottky gate contact 30 are merely exemplary and should be considered non-limiting.

A process for forming the Schottky gate contact precursor 30P is described in association with FIG. 2. Assume that the dielectric layer 20 has already been formed, and the hole that exposes the surface portion 22C of the barrier layer 18 has been etched through the dielectric layer 20. Initially, a Schottky layer precursor 34P is formed over the upper surfaces of the dielectric layer 20, the side walls of the hole formed in the dielectric layer 20, and the surface portion 22C of the barrier layer 18. In this embodiment, the Schottky layer precursor 34P is formed from nickel (Ni) using known evaporation techniques.

Next, a first diffusion barrier layer precursor 36P is formed over the Schottky layer precursor 34P. In this embodiment, the first diffusion barrier layer precursor 36P is formed from silicon (Si) using known evaporation techniques. A second diffusion barrier layer 38 is formed over the first diffusion barrier layer precursor 36P. In this embodiment, the second diffusion barrier layer 38 is formed from titanium (Ti) using known evaporative techniques. A third diffusion barrier layer 40 is formed over the second diffusion barrier layer 38. In this embodiment, the third diffusion barrier layer 40 is formed from platinum using known evaporative techniques. A contact layer 42 is formed over the third diffusion barrier layer 40. In this embodiment, the contact layer 42 is formed from gold (Au) or aluminum (Al) using known evaporative techniques. Finally, a protection layer 44 is formed over the contact layer 42 using known evaporative techniques. In this embodiment, the protection layer 44 is formed from Ti. While evaporative techniques are described for applying the various layers of the Schottky gate contact precursor 30P, known sputtering or like deposition techniques may be used as an alternative.

While the thicknesses of the various layers of the Schottky gate contact precursor 30P may vary, the following thicknesses are provided merely for reference and should not be considered to limit the scope of the disclosure. The thickness of the Schottky layer precursor 34P may range from 120 Angstroms to 600 Angstroms. The thickness of the first diffusion barrier layer precursor 36P may range from 80 Angstroms to 650 Angstroms. The thickness of the second diffusion barrier layer 38 may range from 50 Angstroms to 300 Angstroms. The thickness of the third diffusion barrier layer 40 may range from 50 Angstroms to 300 Angstroms. The thickness of the contact layer 42 may range from 1000

Angstroms to 10000 Angstroms, and the thickness of the protection layer 44 may range from 50 Angstroms to 200 Angstroms.

After the protection layer 44 is formed, the HEMT 10 is subjected to a thermal annealing process. Notably, the thicknesses of the Schottky layer precursor 34P and the first diffusion barrier layer precursor 36P are selected such that in a subsequent annealing process, which is described in detail further below, the Ni and Si of these respective layers react with one another to form a Schottky layer 34 formed of Ni and a first diffusion barrier layer 36 formed of nickel silicide ($Ni_xSi$), as shown in FIG. 3. In this embodiment, the Si of the first diffusion barrier layer precursor 36P is substantially completely consumed by the reaction caused by the annealing process, such that the first diffusion barrier layer precursor 36P that is formed from Si is essentially no longer present. Although the Si is consumed during the reaction, not all of the Ni of the Schottky layer precursor 34P is consumed. As such, the remaining Ni effectively forms a Schottky layer 34 of Ni.

In certain embodiments, the thickness of the Ni for the Schottky layer precursor 34P is greater than or equal to about 0.54 times the thickness of the Si for the first diffusion barrier layer precursor 36P. While the various layers illustrated in the figures are not drawn to scale, the thickness of the Ni for the Schottky layer precursor 34P is about 0.6 times the thickness of the Si for the first diffusion barrier layer precursor 36P in the illustrated embodiment.

For the HEMT 10, Ni is a desired material for the Schottky layer 34, especially when the barrier layer is formed from AlGaN, because Ni has a high barrier height with AlGaN. Notably, Ni may readily diffuse into, and thus mix with, certain other metals in the absence of an appropriate diffusion barrier. For example, Ni readily mixes with Au and Al. When formed with $Ni_xSi$, the first diffusion barrier layer 36 has proven to be an excellent diffusion barrier that substantially prevents Ni from the Schottky layer 34 from mixing with the Au or Al of the contact layer 42 or with the Pt of the third diffusion barrier layer 40.

The Ti of the second diffusion barrier layer 38 substantially prevents mixing of the Au or Al of the contact layer 42 or the Pt of the third diffusion barrier layer 40 with the $Ni_xSi$ of the first diffusion barrier layer 36. At lower annealing temperatures, such as those below 400 Celsius, Ti will not react with the $Ni_xSi$ of the first diffusion barrier layer 36. The Pt of the third diffusion barrier layer 40 substantially prevents mixing of the Ti of the second diffusion barrier layer 38 and the Au or Al of the contact layer 42. The Au or Al of the contact layer 42 facilitates a low resistance path to the gate region of the HEMT 10. The Ti of the protection layer 44 provides a protective coating over the Au or Al of the contact layer 42, which is generally susceptible to damage or erosion during subsequent processing and operation of the HEMT 10.

As indicated above, the annealing process may take place after each of the layers (34-44) of the Schottky gate contact is formed and etched to the shape illustrated in FIG. 3. In one embodiment, the annealing process is provided in a rapid thermal annealing (RTA) machine, which is commonly available in semiconductor fabrication facilities. In general, the annealing process involves heating the HEMT 10 at a desired temperature for a given period of time or heating the HEMT 10 to various temperatures according to a defined heating profile. Various annealing processes are acceptable. The following provides exemplary annealing processes.

For the first exemplary annealing process, the HEMT 10 is initially loaded into the RTA machine at room temperature. For the first step, the ambient temperature of the HEMT 10 is ramped to 250° C. over a one (1) minute period. After ramping the ambient temperature to 250° C., the ambient temperature is maintained at 250° C. for five (5) to ten (10) minutes for the second step. During this time some of the Ni from the Schottky layer 34 diffuses into the Si of the first diffusion barrier layer precursor 36P (FIG. 2). After the second step, the ambient temperature is quickly raised to 350° C. to 400° C. over a 45 to 60 second period for the third step. The HEMT 10 is held at the ambient temperature of 350° C. to 400° C. for about two (2) minutes, for the fourth step. After the fourth step, the ambient temperature is rapidly dropped to 150° C. or less in 60 seconds or less, wherein the HEMT 10 is allowed to cool.

In an alternative process, the ambient temperature may be slowly ramped to a desired temperature and held for a desired period. For example, the ambient temperature may be ramped to 375° C. over a two (2) minute period, and held at 375° C. for two (2) to five (5) minutes before being cooled.

The annealing process is generally controlled to allow for the Si of the first diffusion barrier layer precursor 36P to be substantially completely consumed by the reaction of the Si of the first diffusion barrier layer precursor 36P with some of the Ni of the Schottky layer precursor 34P to form the first diffusion barrier layer 36 of $Ni_xSi$. As such, the annealing temperature and the length of the annealing process should be sufficient to allow for the consumption of the Si of the first diffusion barrier layer precursor 36P and the resultant formation of the $Ni_xSi$ for the first diffusion barrier layer 36. However, the annealing temperatures and the length of the annealing process should be limited to prevent or at least substantially minimize the diffusion of the Ti of the second diffusion barrier layer 38 into the $Ni_xSi$ of the first diffusion barrier layer 36. When Ti is used for the second diffusion barrier layer 38 and the first diffusion barrier layer 36 is $Ni_xSi$, the annealing temperatures are generally maintained below 400° C. throughout the annealing process to prevent, or at least substantially minimize, the diffusion of the Ti into the $Ni_xSi$.

The thickness of the Schottky layer 34 may range from 40 Angstroms to 300 Angstroms, and the thickness of the first diffusion barrier layer 36 may range from 100 Angstroms to 800 Angstroms. While Ni, Si, Ti, Pt, Au, and Ti are respectively used in the embodiment described above for the Schottky layer precursor 34P, the first diffusion barrier layer precursor 36P, the second diffusion barrier layer 38, the third diffusion barrier layer 40, the contact layer 42, and the protection layer 44, these layers are not limited to these materials. These materials have simply been found to work well in devices where the Schottky gate contact 30 or like Schottky contact is formed on group III-nitride material, such as AlGaN. As such, the resultant silicide for the first diffusion barrier layer 36 is a silicide of the material used for the Schottky layer precursor 34P, and thus, the Schottky layer 34. For example, the Schottky layer precursor 34P could be formed from Platinum (Pt). As a result of annealing, the silicide of the first diffusion barrier layer 36 would be Platinum Silicide (PtSi). The second diffusion barrier layer 38 could be formed from Titanium (Ti) or Titanium Tungsten (TiW). The third diffusion barrier layer 40 could be formed from Platinum.

Figure 4:
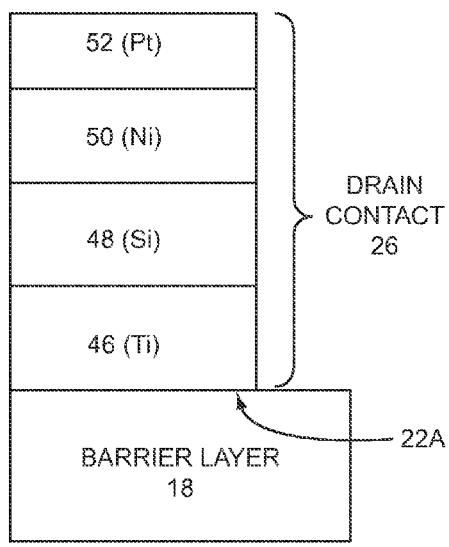
FIG. 4 illustrates a drain contact for the HEMT of FIG. 1.
Figure 5:
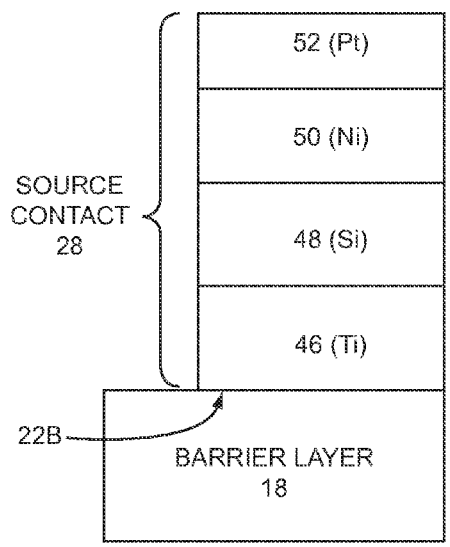
FIG. 5 illustrates a source contact for the HEMT of FIG. 1.

Exemplary structures for the drain contact 26 and the source contact 28 are shown in FIGS. 4 and 5, respectively. In this embodiment, the drain contact and the source contact 28 are formed on the respective surface portions 22A and 22B of the barrier layer 18 of the HEMT 10. However, the additional layers may be provided between the barrier layer 18 and either of drain contact 26 and the source contact 28. Further, the drain contact 26 and the source contact 28 may be recessed into the barrier layer 18.

In the illustrated embodiment of FIGS. 4 and 5, each of the drain contact 26 and the source contact 28 includes a first contact layer 46, a second contact layer 48 over the first contact layer 46, a third contact layer 50 over the second contact layer 48, and a fourth contact layer 52 over the third contact layer 50. Each of the contact layers (46, 48, 50, 52) may be formed using evaporative, sputtering, or like deposition techniques. Further, one or more of these contact layers (46, 48, 50, 52) may be formed at the same time and using the same material as corresponding layers of the Schottky gate contact 30 or Schottky gate contact precursor are being formed.

As illustrated, the first contact layer 46 is formed from Ti; however, alternative materials may be used. The second contact layer 48 is formed from Si; however, alternative materials may be used. The third contact layer 50 is formed from Ni; however, alternative materials may be used. The fourth contact layer 52 is formed from Pt; however, alternative materials may be used.

Figure 6:
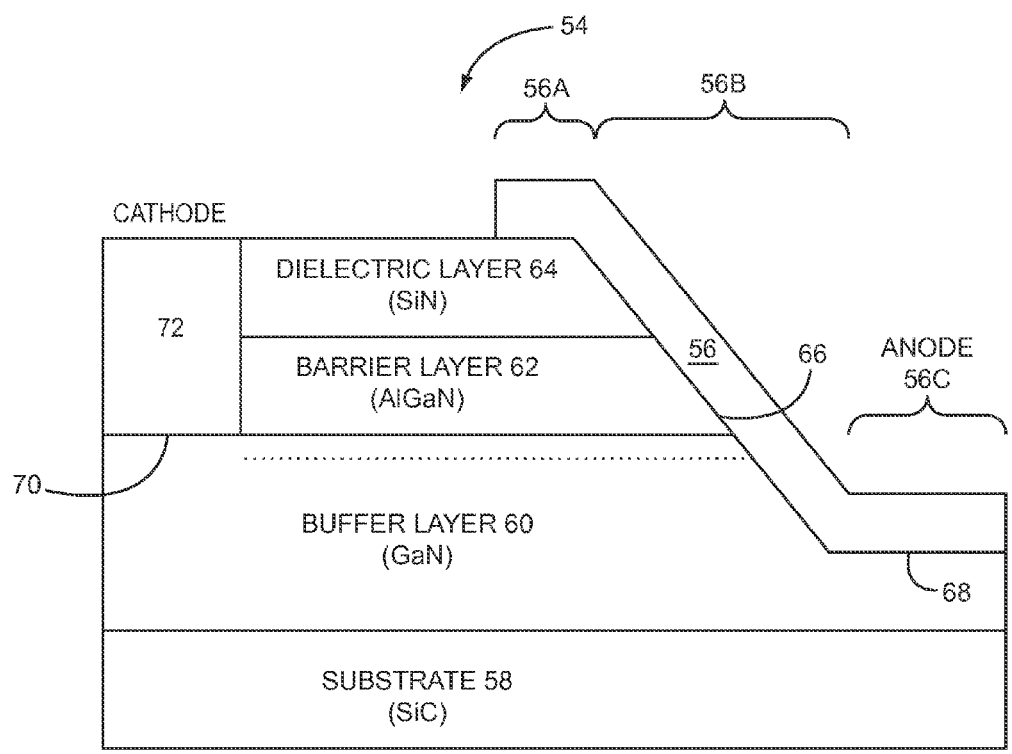
FIG. 6 illustrates a lateral Schottky diode according to one embodiment of the disclosure.

The structure used for the Schottky gate contact 30 of FIG. 3 can be applied to any type of semiconductor device that employs a Schottky contact. The devices include, but are not limited to SiC, MESFETs, and Schottky diodes, such as the Schottky diode 54 that is illustrated in FIG. 6. The Schottky diode 54 illustrated is a GaN-based, lateral Schottky diode that has an anode contact 56 that is formed in the same manner as the Schottky gate contact 30 described above in association with the HEMT 10.

As illustrated, the Schottky diode 54 is formed on a SiC substrate 58, wherein a GaN buffer layer 60 is formed over the substrate 58, and an AlGaN barrier layer 62 is formed over the buffer layer 60. Other layers, such as nucleation layers and the like, may be provided between the illustrated layers, as will be appreciated by those skilled in the art. A SiN dielectric layer 64 is formed over the barrier layer 62.

The right side of the structure is etched to form an angled wall 66 that runs along all of the dielectric layer 64 and the barrier layer 62 and into an etched recess 68 in the buffer layer 60. The anode contact 56 is formed over a portion of the dielectric layer 64 (56A), along the angled wall 66 (56B), and along the recessed portion of the buffer layer 60 (56C).

On the left side of the structure, a cathode recess 70 is etched through the dielectric layer 64 and the barrier layer 62 to the buffer layer 60. A cathode contact 72 is formed over the cathode recess 70. A 2-DEG plane is formed during operation just below the junction of the barrier layer 62 and the buffer layer 60 and between the anode contact 56 and the cathode contact 72. Notably, the portion 56A of the anode contact 56 that resides on the top surface of the dielectric layer 64 may serve as a field plate.

Figure 7:
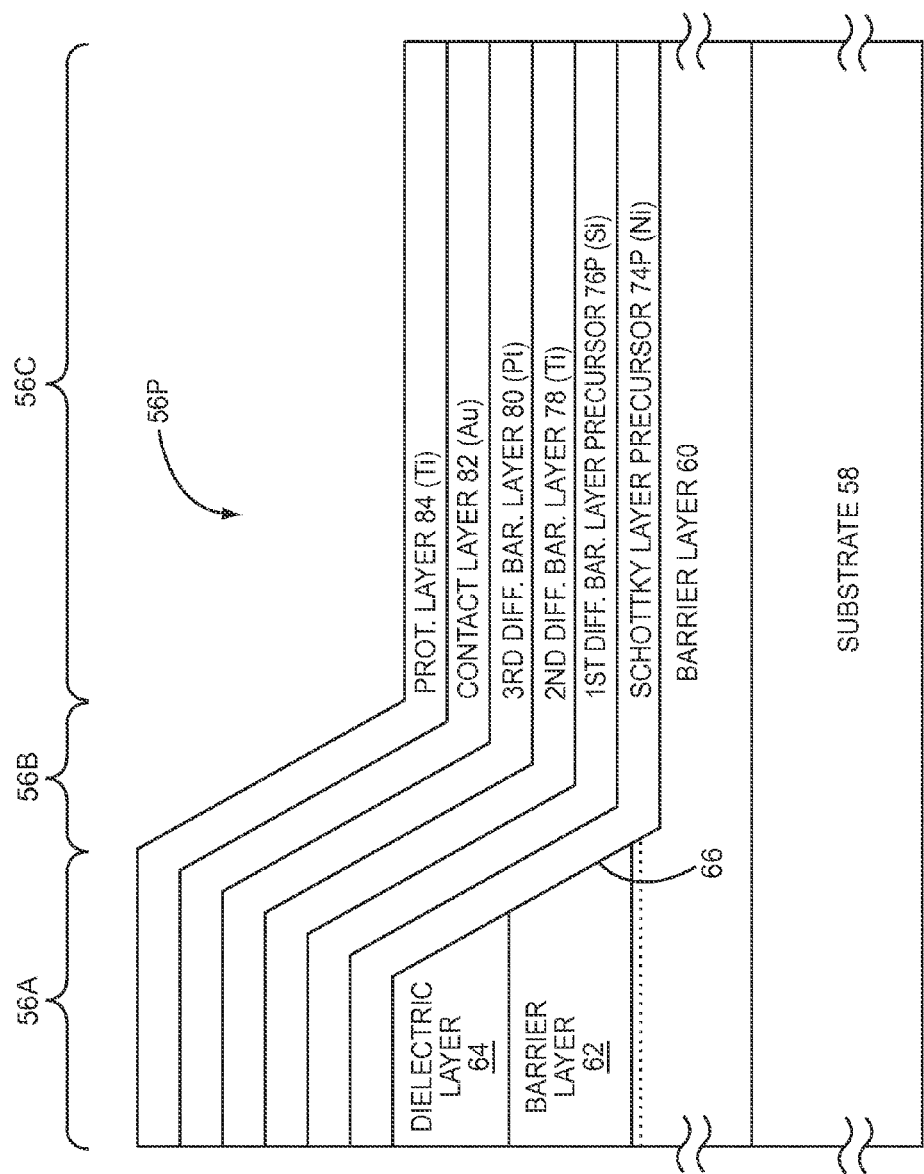
FIG. 7 illustrates an anode contact precursor according to one embodiment of the disclosure.
Figure 8:
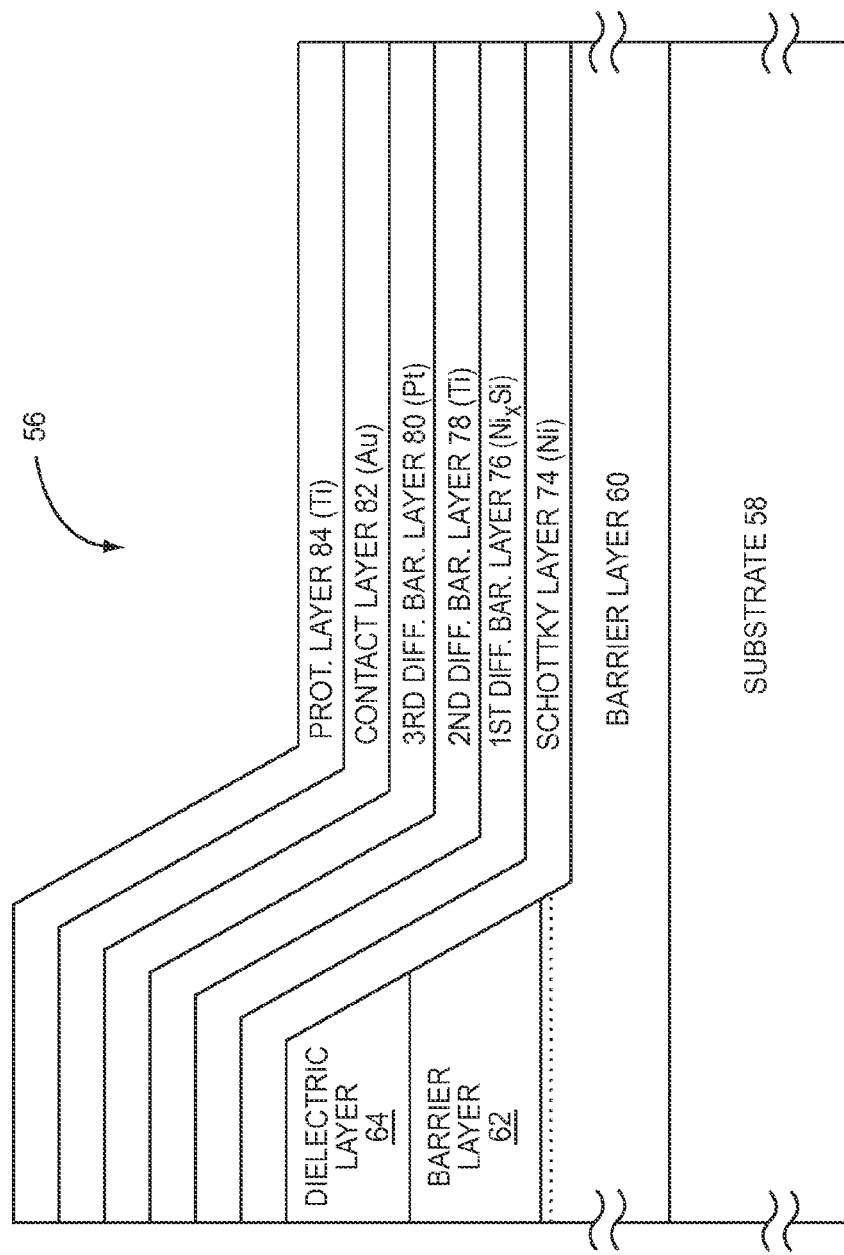
FIG. 8 illustrates an anode contact after the anode contact precursor is subjected to thermal annealing according to one embodiment of the disclosure.

With reference to FIGS. 7 and 8, an exemplary process for forming the anode contact 56 is described. This process is analogous to the process illustrated above for forming the Schottky gate contact 30. FIG. 7 illustrates the structure of an anode contact precursor 56P, which is annealed as described above to form the actual structure of the anode contact 56, which is illustrated in FIG. 8.

An exemplary process for forming the anode contact precursor 56P is described in association with FIG. 7. Assume that the angled wall 66 has already been formed. Initially, a Schottky layer precursor 74P is formed over at least a portion of the dielectric layer 64 (56A), along the angled wall 66 (56B), and along the recessed portion of the buffer layer 60 (56C). In this embodiment, the Schottky layer precursor 74P is formed from nickel (Ni).

Next, a first diffusion barrier layer precursor 76P is formed over the Schottky layer precursor 74P. In this embodiment, the first diffusion barrier layer precursor 76P is formed from silicon (Si). A second diffusion barrier layer 78 is formed over the first diffusion barrier layer precursor 76P. In this embodiment, the second diffusion barrier layer 78 is formed from titanium (Ti). A third diffusion barrier layer 80 is formed over the second diffusion barrier layer 78. The third diffusion barrier layer 80 is formed from platinum using known evaporation techniques. A contact layer 82 is formed over the third diffusion barrier layer 80. The contact layer 82 is formed from gold (Au) or aluminum (Al). Finally, a protection layer 84 is formed over the contact layer 82. In this embodiment, the protection layer 84 is formed from Ti. While evaporative techniques may be used for applying the various layers of the anode contact precursor 56P, known sputtering or like deposition techniques may be used an alternative.

After the protection layer 84 is formed, the Schottky diode 54 is subjected to a thermal annealing process, which is described in detail above. In general, the thicknesses of the Schottky layer precursor 74P and the first diffusion barrier layer precursor 76P are selected such that in a subsequent annealing process, which is described in detail further below, the Ni and Si of these respective layers react with one another to form a Schottky layer 74 formed of Ni and a first diffusion barrier layer 76 formed of a nickel silicide ($Ni_xSi$), as shown in FIG. 8. In this embodiment, the Si of the first diffusion barrier layer precursor 76P is substantially completely consumed by the reaction caused by the annealing process, such that the first diffusion barrier layer precursor 76P that is formed from Si is essentially no longer present. Although the Si is consumed during the reaction, not all of the Ni of the Schottky layer precursor 74P is consumed. As such, the remaining Ni effectively forms a Schottky layer 74 of Ni.

While Ni, Si, Ti, Pt, Au, and Ti are respectively used in the embodiment described above for the Schottky layer precursor 74P, the first diffusion barrier layer precursor 76P, the second diffusion barrier layer 78, the third diffusion barrier layer 80, the contact layer 82, and the protection layer 84, these layers are not limited to these materials. These materials have simply been found to work well in devices where the anode contact 56 or like Schottky contact is formed on group III-nitride material, such as AlGaN. As such, the resultant silicide for the first diffusion barrier layer 76 is a silicide of the material used for the Schottky layer precursor 74P, and thus, the Schottky layer 74.

For example, the Schottky layer precursor 74P could be formed from Platinum. As a result of annealing, the silicide of the first diffusion barrier layer 36 would be Platinum Silicide. The second diffusion barrier layer 78 could be formed from Titanium or Titanium Tungsten. The third diffusion barrier layer 80 could be formed from Platinum.

Those skilled in the art will recognize improvements and modifications to the embodiments of the present disclosure. All such improvements and modifications are considered within the scope of the concepts disclosed herein and the claims that follow.

What is claimed is:

1. A semiconductor device comprising:
   a semiconductor body;
   a Schottky contact comprising:
      a Schottky layer comprising a first metal and formed on the semiconductor body;

a first diffusion barrier layer formed from a portion of the Schottky layer and comprising a silicide of the first metal and formed on at least a portion of the Schottky layer; and a third layer comprising a second metal and formed on the first diffusion barrier layer, wherein the first metal is nickel and the silicide is nickel silicide.

2. The semiconductor device of claim 1 wherein the second metal is one of gold and aluminum.

3. A semiconductor device comprising:
a semiconductor body;
a Schottky contact comprising:
a Schottky layer comprising a first metal and formed on the semiconductor body;
a first diffusion barrier layer formed from a portion of the Schottky layer and comprising a silicide of the first metal and formed on at least a portion of the Schottky layer; and
a third layer comprising a second metal and formed on the first diffusion barrier layer,
wherein the Schottky contact further comprises a titanium layer over the first diffusion barrier layer.

4. The semiconductor device of claim 3 wherein the Schottky contact further comprises a platinum layer over the titanium layer.

5. The semiconductor device of claim 4 wherein the third layer is formed over the platinum layer.

6. The semiconductor device of claim 5 wherein a protection layer formed of titanium is formed over the third layer.

7. The semiconductor device of claim 4 wherein the semiconductor body comprises a body layer formed of group-III nitride material and at least a portion of the Schottky contact is formed against a portion of the body layer.

8. A semiconductor device comprising:
a semiconductor body; and
a Schottky contact comprising:
a Schottky layer comprising nickel and formed on the semiconductor body; and
a first diffusion barrier layer formed from a portion of the Schottky layer and comprising nickel silicide and formed on at least a portion of the Schottky layer.

9. The semiconductor device of claim 8 further comprising a third layer comprising a second metal and formed on the first diffusion barrier layer.

10. The semiconductor device of claim 9 wherein the second metal is one of gold and aluminum.

11. The semiconductor device of claim 9 wherein the Schottky contact further comprises a titanium layer over the first diffusion barrier layer.

12. The semiconductor device of claim 11 wherein the Schottky contact further comprises a platinum layer over the titanium layer.

13. The semiconductor device of claim 12 wherein the third layer is formed over the platinum layer.

14. The semiconductor device of claim 13 wherein a protection layer formed of titanium is formed over the third layer.

15. The semiconductor device of claim 9 wherein the semiconductor body comprises a body layer formed of group-III nitride material and at least a portion of the Schottky contact is formed against a portion of the body layer.

* * * * *

UNITED STATES PATENT AND TRADEMARK OFFICE
CERTIFICATE OF CORRECTION

Page 1 of 1

PATENT NO. : 9,640,627 B2
APPLICATION NO. : 13/414286
DATED : May 2, 2017
INVENTOR(S) : Hagleitner et al.

It is certified that error appears in the above-identified patent and that said Letters Patent is hereby corrected as shown below:

On the Title Page
(74) Attorney, Agent or Firm: Please correct "Myers Bigle, P.A." to read -- Myers Bigel, P.A. --

In the Specification
Column 4, Line 13: Please correct "500 micrometers □ thick" to read -- 500 micrometers thick --

Column 5, Line 39: Please correct "1×1018 cm-3" to read -- $1 \times 10^{18}$ cm$^{-3}$ --
       Line 42: Please correct "5×1019 cm-3" to read -- $5 \times 10^{19}$ cm$^{-3}$ --

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*